United States Patent [19]

Templin

[11] 4,081,315
[45] Mar. 28, 1978

[54] CERMET ETCH TECHNIQUE

[75] Inventor: Alan S. Templin, Hermosa Beach, Calif.

[73] Assignee: TRW Inc., Redondo Beach, Calif.

[21] Appl. No.: 689,779

[22] Filed: May 25, 1976

[51] Int. Cl.$^2$ .................. H01L 21/312; B44C 1/22; C03C 15/00; C03C 25/06
[52] U.S. Cl. .................. 156/653; 156/659; 156/662; 156/656; 156/657; 252/79.2; 338/308
[58] Field of Search .................. 156/3, 8, 11, 13, 16, 156/17, 18, 650–657, 659, 661, 662–667; 252/79.2, 79.4; 427/101–103; 29/620; 96/36.2, 38.4; 317/101 A; 338/308

[56] References Cited

U.S. PATENT DOCUMENTS

| | | | |
|---|---|---|---|
| 3,042,566 | 7/1962 | Hardy | 156/18 |
| 3,135,638 | 6/1964 | Cheney et al. | 156/11 |
| 3,398,032 | 8/1968 | Glang et al. | 156/5 |
| 3,682,729 | 8/1972 | Gukelberger et al. | 156/13 |

Primary Examiner—William A. Powell
Attorney, Agent, or Firm—John J. Connors; Jerry A. Dinardo; Benjamin DeWitt

[57] ABSTRACT

An etching process for patterning cermet thin film resistors includes the provision of a layer of molybdenum over the cermet layer to provide a good adherent surface for a photoresist layer subsequently deposited thereon. After the photoresist and molybdenum layers are patterned in separate steps, the cermet is preferentially etched with hot phosphoric acid to produce the desired cermet resistance pattern.

18 Claims, 9 Drawing Figures

CERMET ETCH TECHNIQUE

BACKGROUND OF THE INVENTION

This invention relates to a process for forming cermet thin films in desired resistance patterns, and more particularly, to such a process that provides improved reliability and higher resolution.

Cermet is a resistive compound of silicon monoxide and chromium, or silicon an chromium. Cermet is used to form thin film resistors on monolithic circuits, hybrid circuits, or resistor networks used in conjunction with monolithic and hybrid circuits. In general, cermet is etched to form patterns using either a hydrofluoric-acid-based etchant or lift-off techniques. Several problems are encountered in both of these etching methods.

One of the difficulties associated with the use of hdrofluoric-acid-based etching is that the hydrofluoric acid is not a preferential etchant. It etches the silicon dioxide layer which serves as a diffusion mask and an insulator, as well as the cermet, giving rise to pin holes in the silicon dioxide layer or removal of areas thereof. If the pattern of cermet happens to be deposited on the silicon dioxide layer, the silicon dioxide is etched out from under the cermet, leaving the cermet on a pedestal. Another difficulty is that the photoresist that is used to pattern the cermet does not adhere well to the cermet. Because of the poor adherence, the photoresist is undercut, and this gives rise to resolution problems.

The lift-off technique involves etching a pattern in an underlayer such as copper or aluminum and then depositing cermet over the patterned layer so as to fill the voids and cover the patterned layer. A preferential etchant dissolves the supporting underlayer and causes the unsupported cermet to tear away from the cermet-filled voids. The lift-off technique is difficult to control because it involves etching small areas out of a larger field. There is also the problem of providing good adherence of the cermet to the lift-off material underlayer, in that any cleaning treatment of the lift-off material that is effective to provide good adherence of the cermet inevitably results in damaging the lift-off material. Yet another difficulty is posed by requiring the lift-off material to be etched out from under the cermet. The cermet tends to protect the lift-off material from the etchant, with the result that the lift-off material is unetched in many areas and the cermet tears away roughly from these areas and leaves ragged edges.

SUMMARY OF THE INVENTION

According to an embodiment of the invention, an improved process for photolithographically patterning a cermet layer involves the use of an intermediate adhesion layer between the cermet layer and a layer of photoresist. The adhesion layer comprises molybdenum and has been found to maintain good adherence of the overlying photoresist not only during etching of the molybdenum but also during subsequent etching of the cermet. Another feature of the process is the use of hot phosphoric acid to preferentially etch the cermet. Not only does the photoresist remain intact while the cermet is etched but also all other parts of the circuit are immune to the hot phosphoric acid etchant.

DESCRIPTION OF THE PREFERRED EMBODIMENT

Figure 1:
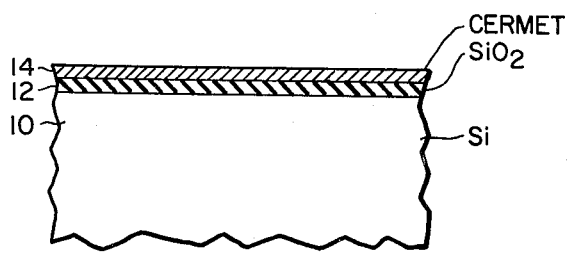
FIGS. 1-3 are sectional views illustrating several initial stages of depositing various layers on a semiconductor substrate acccording to the invention.

An improved process for depositing a layer of cermet material in the form of a desired pattern upon an insulating surface will now be described. The insulating surface may be one of a number of different kinds of material and may be the surface of a substrate such as alumina, or it may be the oxide surface of a silicon wafer, for example. For purposes of specific description, a suitably doped silicon substrate 10 is shown in FIG. 1 as having a layer 12 of silicon dioxide on a surface thereof. The oxide layer 12 may be conventionally grown on the substrate surface as a thermal layer by simply heating the silicon in oxygen atmosphere. To prepare the surface of the oxide layer 12 for reception of a cermet layer, the surface is cleaned by a method which may include the following processing steps:

(1) a 15 minute wash in detergent and water, (2) a 10 minute rinse in deionized water, (3) a vapor degrease in isopropanol, (4) a 15 minute boil in a 50%:50% mixture of hydrogen peroxide and ammonium hydroxide, and (5) a final rinse in deionized water.

A cermet layer 14, is deposited on the clean oxide layer 12 by sputtering, for example, or evaporating simultaneously in vacuum chromium and silicon monoxide to cover the oxide layer 12. The proportions by weight of the constituents of the cermet mixture may vary in the range of 65 to 50% for chromium and 35 to 50% for silicon monoxide. Typically, a cermet layer 14 consisting of 60% chromium and 40% silicon monoxide about 500 angstroms thick has a specific resistivity of 1 $\times$ $10^{-3}$ ohm-cm which provides a sheet resistance of 200 ohms per square. However, the cermet layer 14 may have a thickness in the range of 50 to 10,000 angstroms, and nominally is 1000 angstroms thick.

Figure 2:
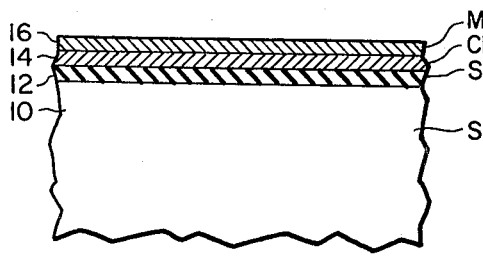

As shown next in FIG. 2, a layer 16 of molybdenum is deposited on the cermet layer 14. The molybdenum layer has a thickness of about 1000 angstroms, for example, but can be as thin as 200 angstroms and as thick as 10,000 angstroms. The molybdenum layer 16 may be deposited by electron beam evaporation in vacuum or by sputtering.

Figure 3:
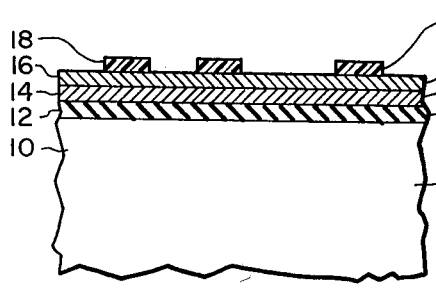
Figure 4:
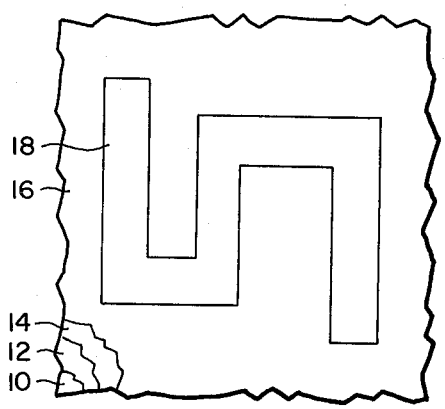
FIG. 4 is a plan view corresponding to the stage of the process illustrated in FIG. 3.

The molybdenum layer 16 adheres well to the cermet layer 14 and provides a good adherent surface for a photoresist layer 18 which is next deposited thereon and formed into a desired pattern by well known photolithographic techniques. The patterned photoresist layer 18 is shown in cross section in FIG. 3 and in plan view in FIG. 4. The photoresist layer 18 follows a simple pattern corresponding to the pattern it is desired for the cermet layer 14 to ultimately assume. In this particular example shown, the pattern is a simple serpentine one.

Figure 5:
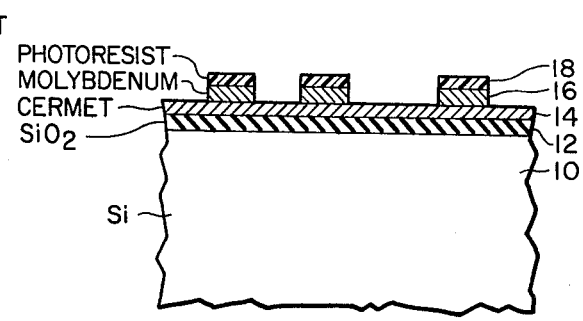
FIGS. 5-9 are sectional views illustrating subsequent stages of depositing and patterning layers on a semiconductor substrate according to the invention.

In the next step, the molybdenum layer 16 is etched to remove metal from those areas that are not protected by the photoresist. A suitable etchant for removing the exposed molybdenum without attacking the photoresist is one containing by volume 70 parts phosphoric acid, 15 parts acetic acid, 3 parts nitric acid, and 5 parts deionized water. The etchant may be applied at room temperature for about 30 seconds per 1000 angstroms of molybdenum and will remove the unprotected molybdenum down to the cermet layer 14, as shown in FIG. 5.

Figure 6:
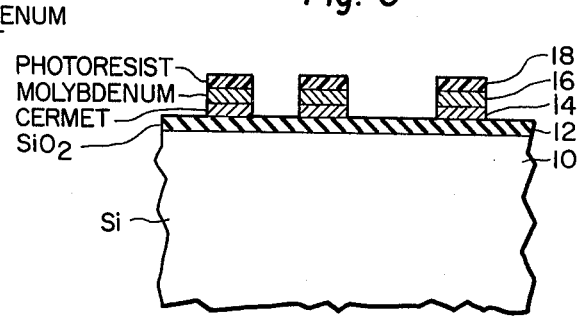

The next part of the process is to remove the exposed regions of the cermet layer 14. The exposed cermet may be removed prior to or subsequent to removal of the photoresist layer 18. Both alternatives will be described. Referring now to FIG. 6, the exposed cermet may be etched, prior to removal of the photoresist layer 18, with hot phosphoric acid, preferably gently boiling at 175° to 180° C. Somewhat lower temperature may be used, but the etching process would take longer. Boiling phosphoric acid at 175° to 180° C will remove the cermet at a rate of about 3 minutes per 1000 angstroms without attacking either the photoresist layer 18 or the molybdenum layer 16.

The temperature of the phosphoric acid is maintained at the desired temperature by adding a quantity of de-ionized water and including a condenser to trap any evaporated water and return it to the boiling solution. In addition, some sulphuric acid is added to the phosphoric acid to prevent the phosphoric acid from etching exposed N+ doped silicon areas. The ratio of phosphoric acid to sulphuric acid is about 10:1 by volume.

Figure 7:
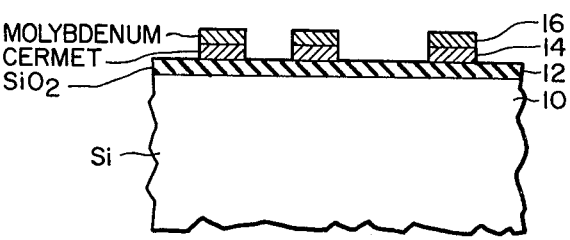

After the exposed cermet is removed, the photoresist layer 18 may be removed by using a commercial stripper, leaving only the molybdenum layer 16 superposed on the cermet layer 14 formed in the desired pattern, as shown in FIG. 7.

Figure 8:
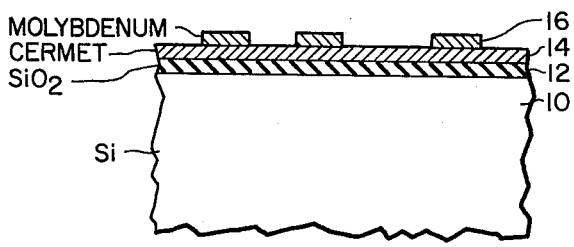

Alternatively, the photoresist layer 18 may be removed prior to etching the cermet layer 14, as shown in FIG. 8, in which case the order of the two process steps described above may be reversed. When the latter procedure is followed, the cermet layer 14 is masked in the unexposed regions from the phosphoric acid etchant by the molybdenum layer 16, alone, whereas in the former case, both the molybdenum layer 16 and the photoresist layer 18 serve to protect the masked regions of the cermet layer 14 from the phosphoric acid etchant.

Figure 9:
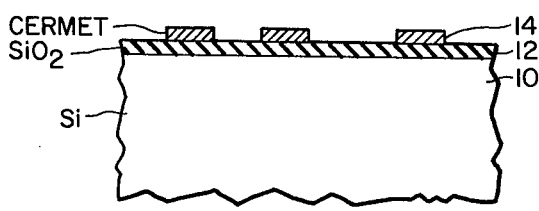

When the process reaches the stage shown in FIG. 7, all that remains is to remove the molybdenum layer 16. The same etchant that was used to pattern the molybdenum layer to reach the stage of the process shown in FIG. 5 may be used to remove the remaining molybdenum layer 16 superposed on the cermet layer 14, and thereby reach the final stage of the patterning process shown in FIG. 9, where only the cermet resistive layer 14 remains formed in the desired serpentine pattern on the silicon dioxide layer 12. The patterned cermet layer 14 will now have a resistance value approximating that required for the particular circuit in which it is used. However, in most applications, a more precise value of resistance is required. Therefore, the cermet layer 14 may be subjected to further processing steps, such as laser trimming to anneal or remove cermet material and thereby reduce or increase the resistance. It will be understood that the cermet layer 14 will be connected at both ends to other microelectronic circuit elements which are not shown.

Among the advantages of the improved process according to the invention are the excellent resolution and high yield afforded thereby. The cermet etchant is truly preferential in that no other parts of the circuit are attacked when the cermet is etched. No similar problem of adhering the cermet layer to an underlayer is encountered, as in the lift-off technique, since the silicon dioxide supporting surface can be stringently cleaned without damage prior to cermet deposition. The process also makes use of standard well established photoresist techniques, which are reliable and relatively easy to use, and is compatible with both negative and positive photoresists.

What is claimed is:

1. The method of manufacturing thin film cermet resistance patterns, on a dielectric substrate, comprising the steps of:
    (a) forming on said substrate a layer of cermet comprising primarily a resistive compound of silicon and chromium;
    (b) forming a masking layer over said cermet layer so as to expose selected areas of said cermet layer; and
    (c) etching away the cermet at said selected areas by subjecting said areas to an etchant comprising primarily phosphoric acid at a temperature of the order of 180° C.

2. In a method of manufacturing thin film resistors involving the deposition on a dielectric substrate of a layer comprising primarily a compound of silicon and chromium and subsequent removal of selected portions of said layer to form a predetermined cermet resistor pattern, the improvement comprising: subjecting said selected portions to phosphoric acid at a temperature of about 180° C for a time sufficient to chemically remove said selected portions and expose the underlying substrate without substantially eroding said substrate.

3. A method of forming thin film resistive elements on a dielectric substrate comprising:
    (a) depositing a layer of cermet material comprising primarily compounds of silicon and chromium on said substrate;
    (b) depositing a masking member on said cermet layer so as to expose selected areas of said cermet layer corresponding to a desired pattern; and
    (c) subjecting the exposed areas of said cermet layer to phosphoric acid at a temperature of about 180° C for a sufficient time to chemically remove said exposed cermet layer areas without removing the masked areas.

4. The invention according to claim 3 wherein said masking member includes a layer of material that is chemically resistant to hot phosphoric acid.

5. The invention according to claim 3 wherein said phosphoric acid is maintained gently boiling at about 175° to 180° C.

6. The invention according to claim 4 wherein said masking member includes a layer of molybdenum.

7. The invention according to claim 4 wherein said masking member includes a layer of molybdenum followed by a layer of photoresist.

8. The invention according to claim 3 wherein said cermet layer is formed by depositing a mixture of silicon monoxide and chromium.

9. The invention according to claim 8 wherein said mixture includes 35 to 50% silicon monoxide and 65 to 50% chromium.

10. The invention according to claim 3 wherein said cermet layer has a thickness in the range of 50 to 10,000 angstroms.

11. A method of forming thin film resistive elements on a dielectric substrate, comprising:
    (a) forming on said substrate, a layer of cermet material comprising primarily resistive compounds of silicon and chromimum;
    (b) depositing a layer of molybdenum on said cermet layer;

(c) forming a layer of photoresist material on said molybdenum layer according to a desired pattern including voids in the photoresist layer that expose portions of said molybdenum layer;

(d) etching the exposed portions of said molybdenum layer to remove the same and to expose the underlying portions of said cermet layer; and (e) etching the exposed portions of said cermet layer with phosphoric acid at a temperature of the order of 180° C.

12. The invention according to claim 11, and further including removing said photoresist pattern prior to step (e).

13. The invention according to claim 11, and further including step (f) removing said photoresist pattern subsequent to step (e).

14. The invention according to claim 12 and further including, following step (e), removing the remainder of said molybdenum layer to leave remaining the desired pattern of cermet material.

15. The invention according to claim 13 and further including, following step (f), removing the remainder of said molybdenum layer to leave remaining the desired pattern of cermet material.

16. The invention according to claim 11, wherein during step (e) said phosphoric acid is maintained gently boiling at about 175° to 180° C.

17. The invention according to claim 16, wherein said phosphoric acid is present with a small quantity of sulphuric acid.

18. The invention according to claim 17, wherein the ratio of phosphoric acid to sulphuric acid is about 10 to 1 by volume.

* * * * *